United States Patent
Brown et al.

(10) Patent No.: US 6,208,570 B1
(45) Date of Patent: Mar. 27, 2001

(54) REDUNDANCY TEST METHOD FOR A SEMICONDUCTOR MEMORY

(75) Inventors: Brian L. Brown; David R. Brown, both of Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/373,487

(22) Filed: Aug. 12, 1999

Related U.S. Application Data

(60) Provisional application No. 60/096,445, filed on Aug. 13, 1998.

(51) Int. Cl.[7] ..................................................... G11C 7/00
(52) U.S. Cl. ...................... 365/201; 365/200; 365/230.06
(58) Field of Search ............................. 365/201, 230.06, 365/200, 230.01

(56) References Cited

U.S. PATENT DOCUMENTS 5,568,061 * 10/1996 McClure ............................... 365/200
5,808,948 * 9/1998 Kim et al. ............................ 365/201
5,936,269 * 8/1999 Kusaba ................................. 365/200

* cited by examiner

*Primary Examiner*—Richard Elms
*Assistant Examiner*—VanThu Nguyen
(74) *Attorney, Agent, or Firm*—Alan K. Stewart; Wade James Brady, III; Frederick J. Telecky, Jr.

(57) ABSTRACT

A semiconductor memory (300) device having a redundancy test scheme is disclosed. A memory cell array (310) includes a normal section (312) and a redundant section (314, 316, and 318) of memory cells. In a normal mode of operation, the redundant section is selected if an applied address (ADD) corresponds to a defective bit in the normal section. In a redundant test mode of operation, the redundant section is selected based on a redundant test address (DFTRA, DFTCA). If the redundant test address is in the normal select logic level, a normal decode section (306 and 324) is selected. The redundant test address and a redundant test activation signal are applied to a redundant decoder (500). If the redundant test address is in a redundant select logic level and the redundant test activation signal is active, the redundant decoder is selectable based on the applied address value.

11 Claims, 3 Drawing Sheets

| DFTRA | DFTCA | SECTION ADDRESSED |
|---|---|---|
| 0 | 0 | 312 |
| 0 | 1 | 316 |
| 1 | 0 | 314 |
| 1 | 1 | 318 |

| ADD2* | ADD1* | ADD0* | DECODER |
|---|---|---|---|
| ADD_2 | ADD_1 | ADD_0 | DECODER0 |
| ADD_2 | ADD_1 | ADD0 | DECODER1 |
| ADD_2 | ADD1 | ADD_0 | DECODER2 |
| ADD_2 | ADD1 | ADD0 | DECODER3 |
| ADD2 | ADD_1 | ADD_0 | DECODER4 |
| ADD2 | ADD_1 | ADD0 | DECODER5 |
| ADD2 | ADD1 | ADD_0 | DECODER6 |
| ADD2 | ADD1 | ADD0 | DECODER7 |

REDUNDANCY TEST METHOD FOR A SEMICONDUCTOR MEMORY

This application claims priority under 35 USC §119(e)(1) of provisional application Ser. No. 60/096,445 filed Aug. 13, 1998.

TECHNICAL FIELD

The present invention relates generally to semiconductor devices, and more particularly to testing the functionality of redundant memory cells in a semiconductor memory device.

BACKGROUND OF THE INVENTION

Semiconductor memory devices typically include a large number of memory cells, each of which can store one or more bits of data. The memory cells are arranged in an array, having a number of rows and columns. Memory cells within the same row are commonly coupled to a word line, and memory cells within the same column are commonly coupled to a bit line. The memory cells within an array are accessed according to the various memory device operations. Such operations include read operations (common to nearly all memory devices), write operations (common to volatile memory devices), and program and erase operations (common to many nonvolatile memory devices). To access memory cells, an external memory address is applied, which activates a word line. When activated, row decoder circuits couple the data stored within the memory cells to the bit lines of the array. The memory address also activates column decoder circuits, which connect a given group of bit lines to input/output circuits and/or program/erase circuits.

In the course of fabricating a semiconductor memory device, manufacturing defects can give rise to nonfunctional memory cells within an array. In order to preserve the functionality of devices having defective memory cells, redundant memory cells are often used. Redundant memory cells are extra memory cells that are used to replace defective memory cells. A typical redundancy scheme includes row-wise and column-wise redundancy, in which one or more extra rows and/or columns of memory cells are created within the array. In the event an applied memory row address corresponds to a row having a defective memory cell, one of the extra rows of memory cells is accessed in lieu of the row containing the defective memory cell. In the event an applied memory column address corresponds to a column having a defective memory cell, one of the extra columns of memory cells is accessed in lieu of the column containing the defective memory cell. Both redundant row and redundant columns are typically needed in order to efficiently repair certain types of defects. For example, a redundant row is typically used to replace word line shorts and a redundant column is typically used to replace bit line shorts and sense amplifier defects.

It is also desired to test the redundant memory cells in order to detect defects in the redundancy. If a redundant memory cell is defective then the redundant row and/or redundant column that is associated with that cell will not be used to repair a normal defective memory cell. Thus, the overall yield (fully functional chips/chips manufactured) will be improved. In order to reduce test time, it is desirable to test the redundant memory cells in as short a time as possible. Testing is typically done at the wafer level (i.e. after processing, but while individual chips are still embedded on a contiguous silicon wafer), and there may be hundreds or more individual chips on a single silicon wafer. Thus, reductions in test time, which increase throughput, can reduce the cost of manufacturing a memory device by allowing fewer test equipment at the redundancy test procedure (sometimes known as laser probe because a laser may be used to evaporate fusible links). Furthermore, it is desirable to have a simplified testing method in order to make the test programs as simple as possible to reduce possible mistakes or further inefficiencies in the test algorithms.

Referring now to FIG. 1, a dynamic random access memory (DRAM) is set forth in a block schematic diagram, and designated by the general reference character 100. The DRAM 100 includes an address buffer 102, a design-for-test (DFT) control 104, a row decoder 106, and a redundant row decoder 108. The address buffer 102 receives externally applied address signals (ADD) and in response to control signals (not shown) will apply the address signals to either an internal row address bus (INTRADD) or an internal column address bus (INTCADD). In response to the INTRADD signals, either a normal word line will be activated by way of the row decoder 106 or in the event the internal row address INTRADD corresponds to a defective normal word line, a redundant word line will be activated by way of the redundant row decoder 108. The activated word line will select a row of memory cells from a memory array 110, selected of which data may be read from or written to.

The selected row of memory cells are coupled to a bank of sense amplifiers. The bank of sense amplifiers is shown to have a normal sense amplifier bank portion 120 and a redundant sense amplifier bank portion 122. The sense amplifier bank (120 and 122) amplifies a relatively small differential voltage placed on bit lines (not shown) in the array 110. The internal column address INTCADD is received by a column decoder 124 and a redundant column decoder 126. In response to the INTCADD signals, either a normal column will be activated by way of column decoder 124 or in the event the internal column address INTCADD corresponds to a defective normal column, a redundant column will be activated by way of the redundant column decoder 126. The activated row and column will select the memory cells in the array so that data may be read from or written to the selected memory cells by way of external input output lines DQ.

The DRAM 100 further includes a Design-For-Test (DFT) control 104. The DFT control 104 receives control signals CTRL and the internal row address INTRADD and produces a test row redundancy signal DFTRR and a test column redundancy DFTCR. The DFTRR signal is received by the redundant row decoder 108 and the DFTCR signal is received by the redundant column decoder 126.

The DFT control circuit 104 allows the redundant rows and redundant columns to be tested before the defective normal rows, defective normal columns and/or defective bits are repaired. The DFT mode is entered by entering a "key address" by way of the externally applied address signals ADD during a DFT entry cycle. The DFT entry cycle is performed by a predetermined sequence of control signals CTRL and may require an "overvoltage" signal (a predetermined voltage level higher than the external voltage supply) on selected of the externally applied address signals. It is noted that the memory array 110 is divided into four sections, a normal section 112, a redundant row-normal column section 114, a redundant column-normal row section 116, and a redundant row-redundant column section 118. Based on the "key address", either the DFTRR signal becomes active in order to test the redundant row-normal column section 114 in the memory array 110, or the DFTCR signal becomes active in order to test the redundant column-normal row section 116 in the memory array 110, or both the DFTRR signal and DFTCR signal become active in order to test the redundant row-redundant column section 118 in the memory array 110.

It is noted that three different DFT modes are required in order to test all the redundant cells in the memory array 110. Furthermore, a DFT clear cycle may be required before entering the next DFT mode, especially in the event the DFT mode is made to be concurrent (i.e. capable of being entered along with other DFT modes being active). This requires the test algorithm to be complicated and for test time to be lengthened, thus creating a greater potential for error and decreasing the throughput in testing the memory device. This can be greater understood in view of FIG. 2.

FIG. 2 sets forth a test sequence that may be used to test the memory device set forth in FIG. 1. First, the normal array 110 may be tested by operating the DRAM 100 in a normal operating mode, or alternatively a parallel test DFT mode may be entered in order to test a greater number of bits than normal in one cycle. After all of the normal array 112 has been tested, a DFT entry cycle with a predetermined "key address" must be performed in order to test the redundant row-normal column section 114 by activating the DFTRR signal. After the redundant row-normal column section 114 has been tested a DFT Clear cycle may be executed in order to clear the DFT mode register before entering the next DFT mode. Then a DFT entry cycle with a predetermined "key address" must be performed in order to test the redundant column-normal row section 116 by activating the DFTCR signal. After the redundant column-normal row section 116 has been tested a DFT Clear cycle may be executed. Then a DFT entry cycle with a predetermined "key address" must be performed in order to test the redundant row-redundant column section 118 by activating both the DFTRR and DFTCR signals. After the redundant row-redundant column section 118 has been tested a DFT Clear cycle may be executed and other tests performed. Finally, after the DRAM 100 has been thoroughly tested a "laser repair" step is performed in order to program functional redundant rows and/or redundant columns to be responsive to the address of defective normal rows, normal columns, or individual memory bits.

While the DRAM of FIG. 1 allows the redundant memory cells to be tested for functionality before being programmed, it would be desirable to be able to perform the same redundancy integrity check in a more simplified manner, thus allowing a higher throughput and reliability in executing the memory test.

SUMMARY OF THE INVENTION

According to the present invention, a semiconductor memory device has an array which includes a normal array section and a redundant array section. The memory device includes a redundancy test mode of operation that allows the redundant section and normal section to be testable under a single operational mode unlike the prior art which requires more than one mode of operation.

According to one aspect of the invention, the normal array section and redundant array section are selectable based on a test address value when operating in the redundancy test mode.

According to another aspect of the invention, the memory device includes a redundant decoder that has a redundant test decode section that is enabled by a redundant test activation signal.

DETAILED DESCRIPTION OF THE EMBODIMENTS

Figure 1:
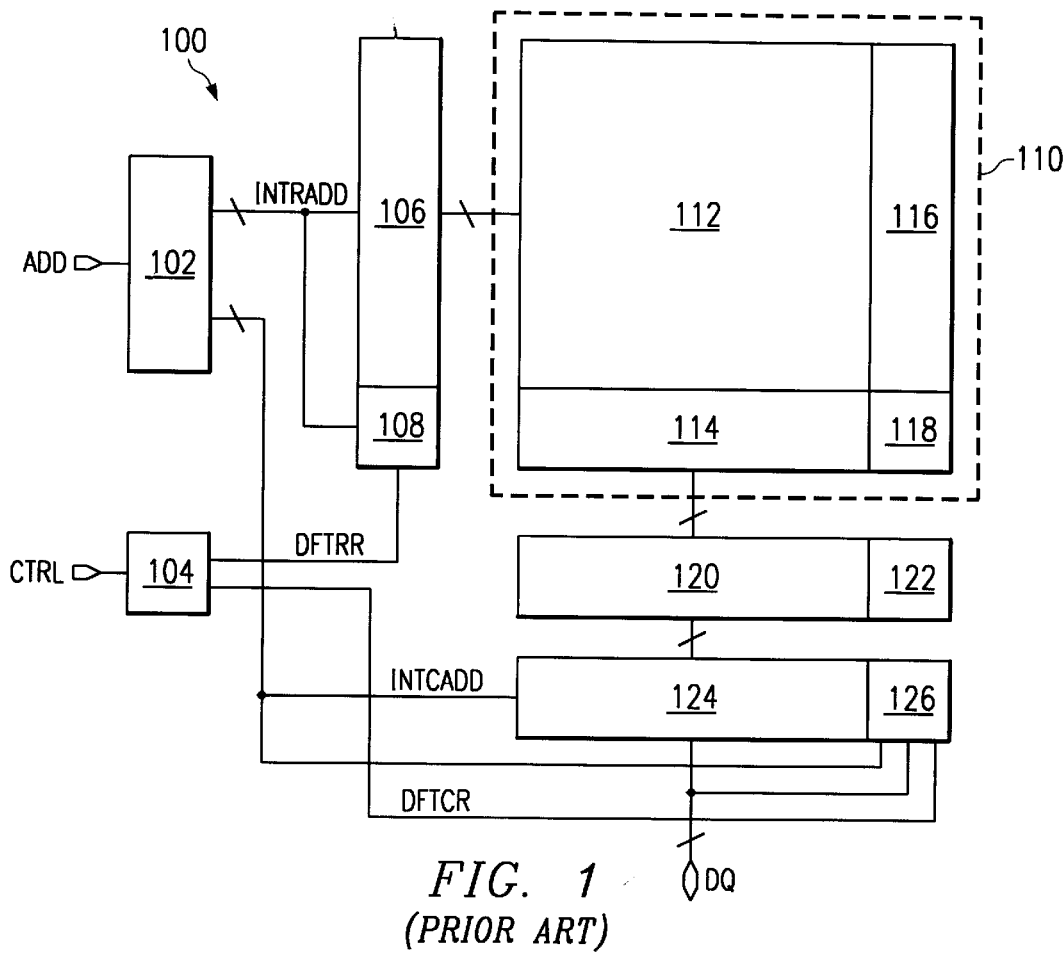
FIG. 1 is a block diagram illustrating a prior art redundancy test scheme in a DRAM.
Figure 2:
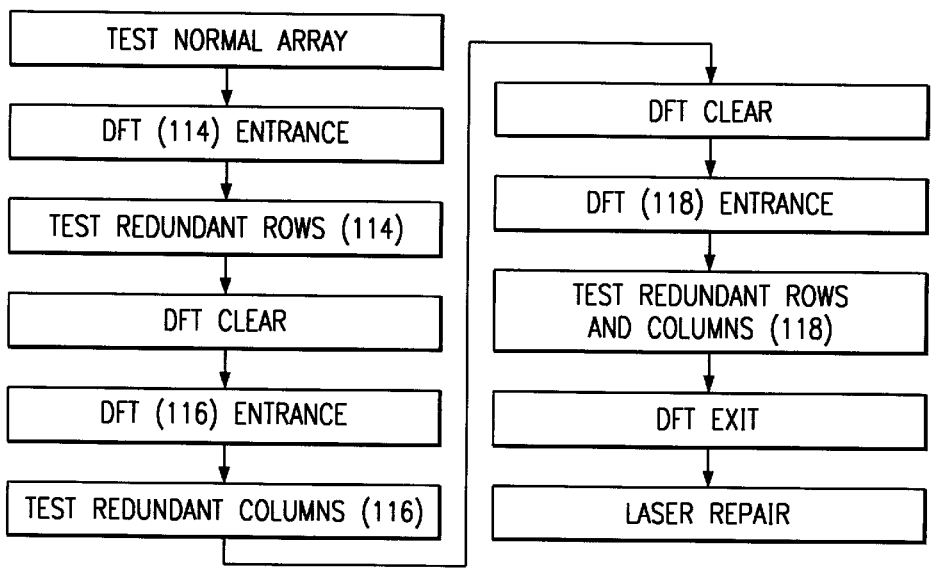
FIG. 2 is a table illustrating a prior art test sequence.

The preferred embodiment is a semiconductor memory device with a novel DFT scheme that allows for a functionality test of redundant memory cells as well as normal memory cells. The operation of the novel DFT scheme will first be described. The memory device with the novel DFT scheme is set forth in a block schematic diagram in FIG. 3. The memory device is a dynamic random access memory (DRAM), and is designated by the general reference character 300. The DRAM 300 has many of the same block components as the DRAM 100 set forth in FIG. 1, these components will have the same reference number as in FIG. 1 except the first number will be a "3" instead of a "1". For example, the address buffer in FIG. 1 has the reference number "102", but the address buffer in FIG. 3 has the reference number "302". It is noted that the DRAM 300 includes a DFT address buffer 328 in which there is no equivalent block in the DRAM 100. Furthermore, it is noted that the DFT control 304 only has one signal output (DFTRED) that controls the redundancy test. The DFT control produces the DFT redundancy enable output DFTRED which is received by both the redundant row decoder 308 and redundant column decoder 326. The DFT address buffer 328 receives an externally applied signal CTRL1/DFTADD and the DFTRED signal and produces a DFT row address signal DFTRA and a DFT column address signal DFTCA. DFTRA is received by the row decoder 306 and the redundant row decoder 308. DFTCA is received by the column decoder 324 and the redundant column decoder 326.

When the address buffer 302 receives the redundancy test "key address" upon the execution of a DFT entry cycle, the DFTRED signal becomes active. DFTRED is coupled to the DFT address buffer 328. The DFT address buffer will then behave in a similar manner to the address buffer 302. The address buffer 302 applies the address received on the external address bus ADD to the internal row address bus INTRADD when control signals (not shown) signify a row operation (typically triggered by an externally applied Row Address Strobe). The address buffer 302 applies the address received on the external address bus ADD to the internal column address bus INTCADD when the control signals signify a column operation (typically triggered by an externally applied Column Address Strobe). The external address is "multiplexed" in that the external address bus ADD will be shared by both the row address and the column address, but not simultaneously, thus the width of the external address bus may be cut in half. When DFTRED is active, the DFT address buffer 328 operates in this same manner. If DFTRED is active and control signals signify a row operation, the externally applied CTRL1/DFTADD will be used to generate the DFT row address signal DFTRA. Likewise, when DFTRED is active and control signals signify a column operation, CTRL1/DFTADD will be used to generate the DFT column address signal DFTCA. DFTRED may be thought of as a redundant test activation signal. The redundant test mode is implemented when the redundant test activation signal is in an activation logic level and other modes (for example normal operating mode) may be implemented when the redundant test mode is in a non-activation logic level.

CTRL1/DFTADD is a control signal when the redundancy test mode is not enabled and is an extra address signal when the redundancy test mode is enabled (DFTRED is in the activation logic level). The redundancy test configuration shown in FIG. 3 allows all bits (both normal and redundant) to be tested by entering a single test mode. This can best be understood by referring to FIG. 4 in conjunction of FIG. 3. The memory array 310 contains 256 normal rows, 256 normal columns, 8 redundant rows and 8 redundant columns. Thus eight row addresses and eight column addresses are required to select a memory cell in the memory array 310. When the DRAM 300 is in the DFT redundancy mode, the CTRL1/DFTADD input is used as an extra address (in this example A8, because the normal addresses required are A0–A7) and the region of memory array 310 that is accessed is dependent upon the CTRL1/DFTADD value as applied to the DFTRA and DFTCA signals. The DFTRA and DFTCA signals can be thought of as test addresses having a redundant select logic level and a normal select logic level for selecting either a redundant section (314, 316, or 318) or a normal section 312 of the array 310.

When DFTRA is "0" and DFTCA is "0" the normal array 312 is accessed and a memory cell as selected according to the values of the internal address buses INTRADD and INTCADD. When DFTRA is "0" and DFTCA is "1" the redundant column-normal row section 316 is addressed and a memory cell is selected according to the values of the internal row address bus INTRADD and the 3 least significant bits of the internal column address bus INTCADD. The 3 least significant bits are used as only three bits are required to decode 1 of 8 redundant columns. When DFTRA is "1" and DFTCA is "0" the redundant row-normal column section 314 is addressed and a memory cell is selected according to the values of the 3 least significant bits of the internal row address bus INTRADD and all 8 bits of the internal column address bus INTCADD. The 3 least significant bits of INTRADD are all that is necessary to decode 1 of 8 redundant rows. When DFTRA is "1" and DFTCA is "1" the redundant row-redundant column section 318 is addressed and a memory cell is selected according to the values of the 3 least significant bits of the internal row address bus INTRADD and the 3 least significant bits of the internal column address bus INTCADD.

Thus, it can be seen that all the bits in the memory array 310 can be tested after entering only a single DFT redundancy test mode. It is noted that DFTRA is received by the row decoder 306 in order to disable the row decoder 306 when DFTRA is at a logic "1", thus the redundant row decoder 308 is enabled. Also, the DFTCA is received by the column decoder 324 in order to disable the column decoder 324 when DFTCA is at a logic "1" and the redundant column decoder 326 is enabled.

As noted, the DFT redundancy test is performed when the DRAM 300 is still part of a contiguous silicon wafer. The bond pads are exposed and probes are placed on the bond pads to input control signals, address signals, data signals, power (VDD) and ground (VSS) to the integrated circuit. The CTRL1/DFTADD bond pad may be a control signal in normal mode that is not needed during the DFT redundancy test mode, thus it can be used an extra address input during the DFT redundancy test mode. The CTRL1/DFTADD bond pad may also be a bond "option" pad that is used as the extra address during the DFT redundancy test mode, but is used as a bond option when the device is put in a package after the semiconductor chips have been "sawed" from the wafer. The bond option can be used to alter the configuration or functionality of the DRAM 300.

Figures 3, 4, 6:
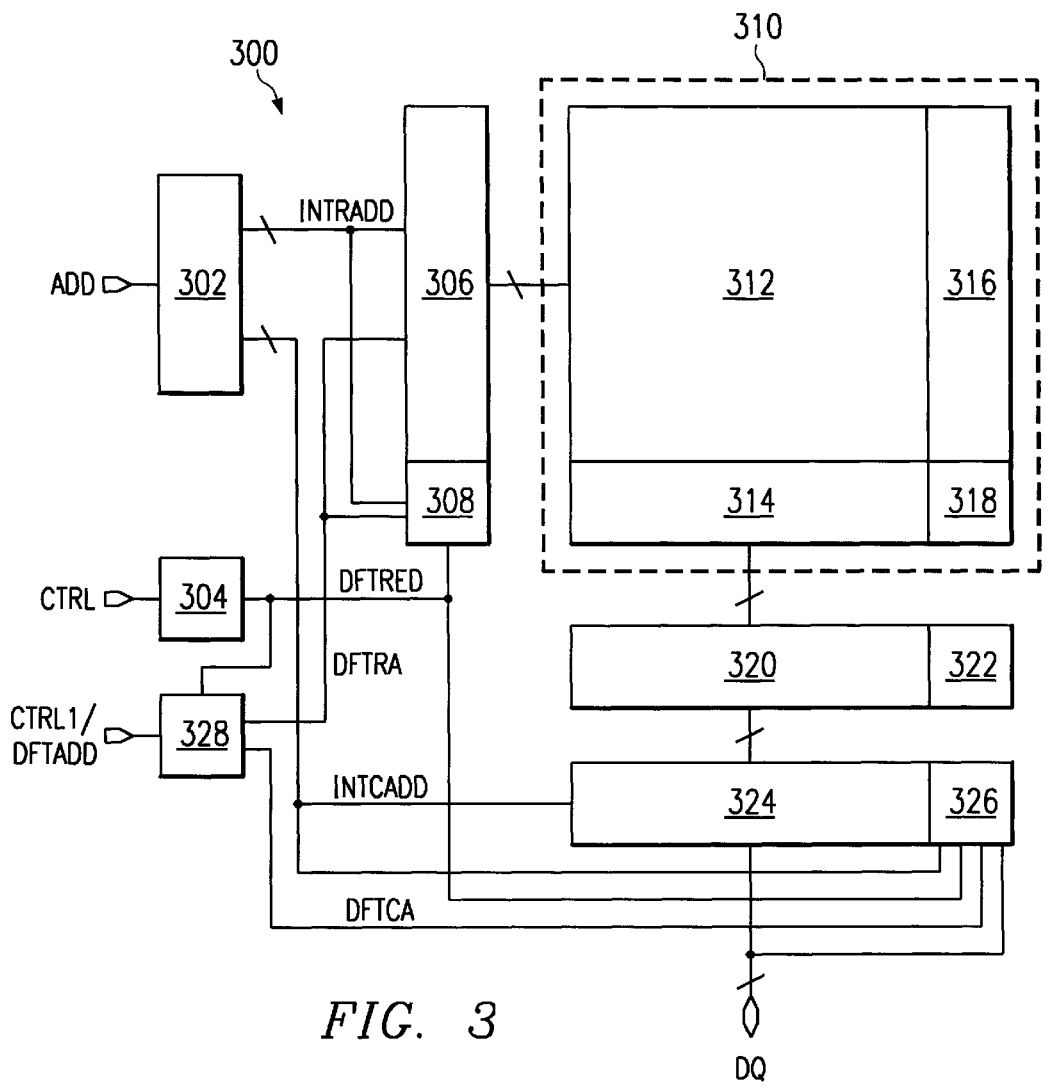
FIG. 3 is a block diagram of a DRAM illustrating the redundancy test scheme according to a preferred embodiment.
FIG. 4 is a table illustrating the array section select decoding according to a preferred embodiment.
FIG. 6 is a table setting forth the decoding for the test decode section of the redundant decoder of FIG. 5.
Figure 5:
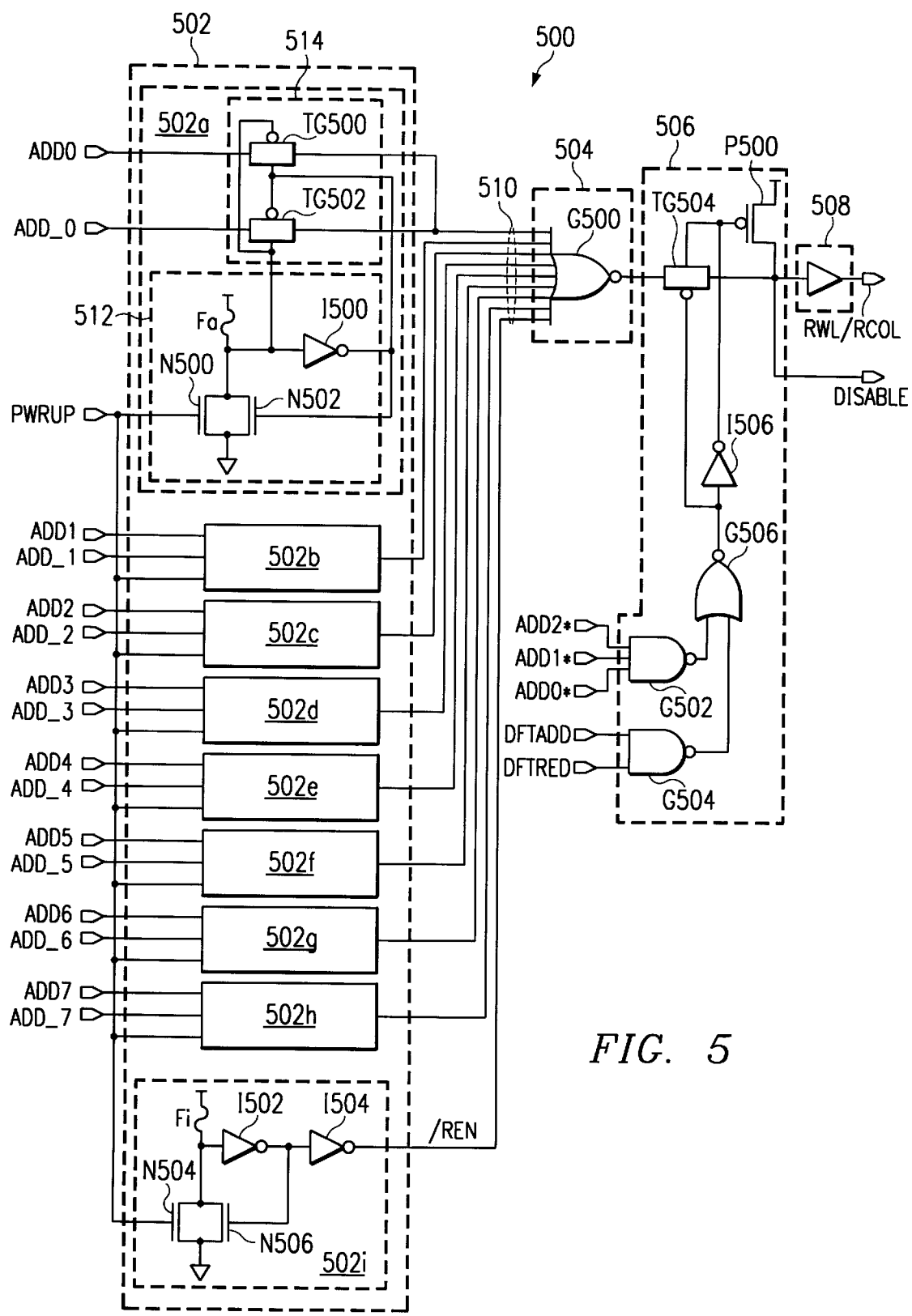
FIG. 5 is a schematic diagram of a redundant decoder according to a preferred embodiment.

The redundant row decoder 308 and redundant column decoder 326 of FIG. 3 are set forth in a schematic diagram in FIG. 5 and designated by the general reference character 500. The redundant decoder 500 has a programmable address circuit 502, a decode gate 504, a test decode 506 and a drive circuit 508. The programmable address circuit 502 receives complementary addresses (ADD0–ADD7 and ADD_0–ADD_7) and a power up signal PWRUP and produces a programmed address 510 and a redundancy enable (/REN). The programmed address 510 and the redundancy enable (/REN) are received by the decode gate 504. The decode gate produces an output that is received by the test decode 506. The test decode 506 receives low order address bits ADD0*, ADD1* and ADD2* as well as the test signals DFTADD and DFTRED. The test decode 506 produces a normal disable signal DISABLE. The normal disable signal DISABLE is received by the drive circuit 508. The drive circuit 508 produces a redundant output RWL/ RCOL, that is either a redundant word line or a redundant column select depending on whether the redundant decoder 500 is used as a redundant row decoder or a redundant column decoder.

The programmable address circuit 502 contains programmable address selectors 502a–502h and a redundancy enable circuit 502i. The programmable address selectors 502a–502h are identical except that each one receives a different address bit and its complement. Programmable address selector 502a receives the lowest order address ADD0 and its complement ADD_0. Programmable address selector 502b receives the second lowest order address ADD1 and its complement ADD_1. Programmable address selectors 502c–502h follow this pattern with programmable address selector 502h receiving address bit ADD7 and its complement ADD_7. A programmable address selector will be discussed with reference to the lowest order programmable address selector 502a. Program address selector 502a contains a program section 512 and a mux section 514. The program section 512 has a fusible link Fa having one end connected to the high power supply VDD and the other end connected to the drains of n-channel MOS transistors N500 and N502. The fusible link Fa is made from polysilicon and is of a low resistance when intact. The fusible link Fa may be "blown" by a laser pulse, after which the fusible link will not conduct current and will thus be considered in an open state. NMOS transistor N500 receives the power up signal PWRUP at its gate and has its source connected to the low power supply VSS. NMOS transistor N502 has its drain connected to the fusible link Fa and its source connected to VSS. An inverter I500 has its input connected to a common node formed by the drains of NMOS transistors N500 and N502 and the fusible link Fa. The gate of NMOS transistor N502 receives the output of the inverter I500. The mux section 514 of the programmable address selector 502a comprises two transfer gates (TG500 and TG502). TG500 receives the low order address bit ADD0 and TG502 receives the complementary address bit ADD_0. Transfer gates TG500 and TG502 have commonly connected outputs that are received by the decode gate 504. The transfer gates receive output signals (common nodes of fuse Fa, N500, and N502; and the output of inverter I500) from the program section 512.

The programmable address selector 502a will either pass the low order address ADD0 or its complement ADD_0 depending on the state of the fusible link Fa. If the fusible link Fa is in the non-blown (closed) state, a low resistive connection is made from VDD to the common drains of N500 and N502. The NMOS transistor of TG502 receives a logic high (VDD) and the PMOS transistor of TG502 receives a logic low (VSS) from the inverter I500, thus TG502 will be on and there will be a low resistive path formed between the address ADD_0 and the output of the mux section 514. This will allow current to flow through the transfer gate TG502 and ADD_0 will pass through to the output of the mux section 514. The PMOS transistor of TG500 receives a logic high and the NMOS transistor of TG500 receives a logic low, thus TG500 will be off and current will not be allowed to flow through the transfer gate TG500. Thus ADD0 will not pass through to the output of the mux section 514.

Likewise, if the fusible link Fa is in the blown (open) state. VDD will be electrically isolated from the common drains of transistors N500 and N502. Therefore, after the DRAM 300 powers up and the power up pulse PWRUP transitions, forcing a logic low at the common drain of transistors N500 and N502, the logic low will be latched by transistor N502 by way of inverter I500. The NMOS transistor of TG500 receives a logic high (VDD) and the PMOS transistor of TG500 receives a logic low (VSS) from the inverter I500, thus TG500 will be on and there will be a low resistive path formed between the address ADD0 and the output of the mux section 514. This will allow current to flow through the transfer gate TG500 and ADD0 will pass through to the output of the mux section 514. The PMOS transistor of TG502 receives a logic high and the NMOS transistor of TG502 receives a logic low, thus TG502 will be off and current will not be allowed to flow through the transfer gate TG502. Thus ADD_0 will not pass through to the output of the mux section 514.

The other programmable address selectors 502b–502h operate in the same manner as the programmable address selector 502a. Depending on the state of the fusible links in the programmable address selectors, the decode gate 504 receives a different combination of address states. This allows the decoder 500 to respond to a predetermined address.

The programmable address circuit also contains a redundancy enable circuit 502i. The redundancy enable circuit 502i has a fusible link Fi having one end connected to VDD and the other end connected to the drains of NMOS transistors N504 and N506. The gate of NMOS transistor N504 receives the power up pulse PWRUP. The common node formed by the connection of the fusible link Fi and the drains of NMOS transistors N504 and N506 form an input to an inverter I502. The output of the inverter I502 is connected to the gate of NMOS transistor N506. The output of I502 provides an input to another inverter I504. Inverter I504 provides a redundancy enable /REN. The redundancy enable circuit 502i operates in the same manner as the program section 512 of the programmable address selector 502a. When the fusible link Fi is intact, VDD is applied to the inverter I502. The inverter I502 outputs a logic low which is then inverted once again by inverter I504 to provide a logic high redundancy enable /REN. When the fusible link Fi is in the "blown" or open state, the power up pulse PWRUP will provide an initial low logic level by way of NMOS transistor N504 to the input of inverter I502. Inverter I502 will provide a logic high to the gate of NMOS transistor N506 which will then latch the logic low to the input of the inverter I502. Inverter I504 will provide a logic low redundancy enable /REN.

The programmed address 510 and the redundancy enable /REN is received by the decode gate 504. The decode gate 504 is drawn as a logic NOR gate G500. If the redundancy enable /REN is at a logic high, the NOR gate G500 produces a logic low output regardless of the state of any of the programmed addresses 510, thus the redundant decoder 500 is disabled. If the redundancy enable /REN is at a logic low (i.e. fusible link Fi is in the "blown" or open state), NOR gate G500 is enabled and will produce a logic high output if all the programmed addresses 510 are at a logic low level.

The decode gate 504 provides an output that is received by the test decode 506. The test decode 506 contains a first test decode gate (NAND gate G502) that receives predetermined addresses (shown as ADD0*, ADD1*, and ADD2*) and a second test decode gate (NAND gate G504) that receives a test address DFTADD and the redundancy test enable DFTRED. The outputs of G502 and G504 are used as inputs to NOR gate G506. NOR gate G506 provides an output to the p-channel MOS transistor of transfer gate TG504. The NOR gate G506 also provides an output to the n-channel MOS transistor of transfer gate TG504 and p-channel MOS transistor P500, by way of inverter I506. The transfer gate TG504 has a common source/drain connected to the output of the decode gate 504 and the other common source/drain provides an input (DISABLE) to the driver 508. The p-channel MOS transistor P500 has its source drain path connected between VDD and the DISABLE signal. DISABLE is so named because when it is at a logic high, it disables the row decoders 306 or column decoders 314 of FIG. 3. The driver 508 receives the DISABLE signal and provides an output RWL/RCOL that either selects a redundant row or a redundant column depending on whether the redundant decoder 500 is used as a redundant row decoder or a redundant column decoder.

When the redundancy test mode is not entered (DFTRED is at a logic low), TG504 will be enabled because the p-channel MOS transistor of TG504 will receive a logic low and the n-channel MOS transistor of TG504 will receive a logic high, thus the decode gate 504 will apply its output to the DISABLE signal via a low impedance path provided by the transfer gate TG504. The redundant row/column will then be selected or remain unselected depending on the logic level input to the driver 508. If DISABLE is at a logic high, RWL/RCOL will be in the select state, but if DISABLE is at a logic low, RWL/RCOL will be in an unselect state. When DFTRED is at a logic low, in order to select the redundant row/column selectable by the redundant decoder 500 the applied addresses ADD0–ADD7 and ADD_0–ADD_7 must "match" the programming of the fuses in the fuse set of the programmable address circuit 502 and the fuse Fi in the redundancy enable circuit 502i is blown. If there is a "match" all the inputs of the decode gate 504 will be at a logic low and the redundant row/column will be used to replace the defective normal row/column that would normally be selected by the predetermined applied address. The memory cells that are connected to the redundant row/column may be read from, written to, or refreshed. When there is a redundant "match", the non-redundant row/column is disabled in order to prevent any data contention between the redundant and non-redundant row/column.

If any of the applied addresses (ADD0–ADD7 and ADD_0–ADD_7) in conjunction with the state of the fuses in the fuse set 502 combine to produce a logic high at any of the inputs to the decode gate 504, then the applied address does not correspond to a redundant address and the redundant row/column is unselected and RWL/RCOL remains low (in the unselected state).

When the redundancy test mode is entered (DFTRED is at a logic high), the test address (DFTADD) is at a logic high, and the predetermined addresses (ADD0*, ADD1*, and ADD2*) are all at a logic high. As a result, the outputs of the first and second test decode gates (G502 and G504) will be low, thus the output of NOR G506 will be high. The transfer gate TG504 will be in the non-conductive state as the p-channel MOS transistor of TG504 will receive a logic high and the n-channel of MOS transistor TG504 will receive a logic low. This will isolate the decode gate 504 from the driver 508, thus the address inputs ADD0–ADD7 and ADD_0–ADD_7 will have no effect on the output (RWL/RCOL) of the redundant decoder 500. The gate of p-channel transistor P500 will receive a logic low, thus a logic high will be applied to DISABLE. DISABLE will disable the non redundant row and column decoders (306 and 320 in FIG. 3). The high DISABLE signal will be applied to driver 508 which will apply a select signal to its redundant row or redundant column by way of RWL/RCOL. Thus, the redundant row/column will be selected and the cells coupled to it may be read from, written to or refreshed.

The DRAM 300 has 8 redundant rows and 8 redundant columns. The redundant decoder 500 of FIG. 5 can be used as the redundant decoder for one of the redundant rows/columns. Thus it is required to use 8 redundant decoders 500 for the 8 redundant rows and 8 redundant decoders 500 for the 8 redundant columns. The addresses ADD2*, ADD1*, and ADD0* along with DFTADD, and DFTRED are used to select the redundant decoder in the redundant test mode. The same DFTRED is used to go to all 16 redundant decoders per array in the DRAM 300. The same DFTADD (corresponding to a redundant test row address) is used to go to all 8 redundant row decoders. The same DFTADD (corresponding to a redundant test column address) is used to go to all 8 redundant column decoders. Each of the separate redundant row decoders 500 receive a different combination of the ADD2*, ADD1*, and ADD0* signals corresponding to different combinations of row addresses to select the redundant decoder in the redundant test mode. This can best be described in conjunction with FIG. 6. For example, the first of eight redundant row decoders 500 would receive RADD_2, RADD_1, and RADD_0, the second redundant row decoder 500 would receive RADD_2, RADD_1, and RADD0, and so on, until the eighth redundant row decoder would receive RADD2, RADD1, and RADD0. In this example, RADDn/RADD_n stands for the $n^{th}$ row address and its complement. The same goes for the first through eighth redundant column decoders, the first of eight redundant column decoders 500 would receive CADD_2, CADD_1, and CADD_0, the second redundant column decoder 500 would receive CADD_2, CADD_1, and CADD0, and so on, until the eighth redundant column decoder would receive CADD2, CADD1, and CADD0. CADDn/CADD_n stands for the $n^{th}$ column address and its complement.

Although the fusible links in the preferred embodiment are polysilicon strips that may be "blown" with a laser, the fusible links may be floating gate MOS devices which can be programmed by way of electron "tunneling" or hot electrons being collected by the floating gate. Alternatively, anti-fuse elements may be used, which are electrical opens, but will become electrical shorts by, for example, applying a high voltage that will cause a dielectric layer to breakdown. In the case of anti-fuse elements, the redundant decoder enable section 502i could apply a redundant enable signal from inverter I502 to the decode gate 504.

Although the decode gate 504 is drawn as a logic NOR, it may be a precharge-discharge "wired" NOR type circuit to improve speed.

In the event the redundant decoder 500 is used as a redundant row decoder, the driver 508 may contain a voltage converter in order to apply a VPP (higher than voltage supply VDD) voltage level to the word line in order to prevent any threshold voltage loss in the DRAM memory cells. The VPP voltage level can be provided by an on-chip charge pump.

Although only one array 312 is shown in the preferred embodiment, it should be understood that this is only one of many sub-arrays in the DRAM 300. Thus, there may be many other identical subarrays, for example, in a 64 Megabit DRAM there would be 1024 such subarrays on the chip with each subarray having redundant rows and redundant columns.

Although the preferred embodiment is described with reference to a DRAM device, the invention can be used advantageously with a ROM, PROM, EEPROM or PLA as well as other devices that use elements arranged in an array of rows and/or columns.

Although the present invention has been described in detail, it should be understood that various changes, substitutions, and alterations could be made without departing from the spirit and scope of the invention as defined by the appended claims.

What is claimed is:

1. A semiconductor memory device, comprising:
    an array of memory cells arranged in rows and columns, the array of memory cells having a normal section and a redundant section;
    a test mode circuit that receives at least one input signal and provides a redundant test mode indication;
    a normal decoder section for selecting the normal section of the array of memory cells;
    a redundant decoder section for selecting the redundant section of the array of memory cells, the redundant decoder section comprising:
        programmable address selectors for receiving address bits and coupled to a power up node;
        a redundancy enable circuit coupled to the power up node;
        a decode gate having inputs coupled to the programmable address selectors and to the redundancy enable circuit; and
        a test decode having inputs coupled to the decode gate, coupled to a low order of the address bits, and coupled to the redundant test mode indication; and
    a test address circuit that receives at least one test address, the test address selecting between the normal section and the redundant section when the redundant test mode indication is active.

2. The semiconductor memory device of claim 1, wherein:
    the normal decoder section has a normal row decoder section for selecting a row of memory cells in the normal section of the array of memory cells; and
    the redundant decoder section has a redundant row decoder section for selecting a redundant row of memory cells in the redundant section of the array of memory cells.

3. The semiconductor memory device of claim 2, further including:
    the test mode circuit further provides a normal mode indication;
    the test address is a test row address having a redundant row decoder section select state and a normal row decoder section select state; and
    the test row address is in the normal row decoder section select state when the normal mode indication is active.

4. The semiconductor memory device of claim 1, wherein:

the normal decoder section has a normal column decoder section for selecting a column of memory cells in the normal section of the array of memory cells; and the redundant decoder section has a redundant column decoder section for selecting a redundant column of memory cells in the redundant section of the array of memory cells.

5. The semiconductor memory device of claim 4, further including:

the test mode circuit further provides a normal mode indication;

the test address is a test column address having a redundant column decoder section select state and a normal column decoder section select state; and the test column address is in the normal column decoder section select state when the normal mode indication is active.

6. A semiconductor memory device, comprising:

an array of memory cells arranged in rows and columns, the array of memory cells having a normal section and a redundant section;

a redundant test control that generates a redundant test activation signal, the redundant test activation signal having a test activation logic level and a test non-activation logic level;

a normal decoder for selecting the normal section of the array of memory cells;

a redundant decoder section for selecting the redundant section of the array of memory cells, the redundant decoder section comprising:

programmable address selectors for receiving address bits and coupled to a power up node;

a redundancy enable circuit coupled to the power up node;

a decode gate having inputs coupled to the programmable address selectors and to the redundancy enable circuit; and a test decode having inputs coupled to the decode gate, coupled to a low order of the address bits, and coupled to the redundant test activation signal;

a test address circuit that receives a test address, the test address selecting between the normal section and the redundant section when the redundant test activation signal is at the test activation logic level.

7. The semiconductor memory device of claim 6, wherein:

the redundant decoder includes a redundant test decode section that is enabled when the test activation signal is at the test activation logic level.

8. The semiconductor memory device of claim 7, wherein:

the redundant test decode section is disabled when the test activation signal is at the test non-activation logic level.

9. The semiconductor memory device of claim 7, wherein:

the test address has a redundant select logic level and a normal select logic level; and the redundant test decode section is selected when the test address is at the redundant select logic level and the test activation signal is at the test activation logic level.

10. The semiconductor memory device of claim 9, wherein:

the normal decoder is selected when the test address is at the normal select logic level and the test activation signal is at the test activation logic level.

11. The semiconductor memory device of claim 6, further comprising:

a control circuit that receives a plurality of control input signals and provides a normal mode indication having an active state and an inactive state; and the test activation signal is at the test non-activation logic level when the normal mode indication is in the active state.

* * * * *